United States Patent [19]

Dobyns et al.

[11] Patent Number: 4,813,194
[45] Date of Patent: Mar. 21, 1989

[54] COMPOSITE CHASSIS FOR ELECTRONIC APPARATUS

[75] Inventors: Kenneth P. Dobyns; James R. Tsadilas, both of Beaverton, Oreg.

[73] Assignee: Tektronix, Inc., Beaverton, Oreg.

[21] Appl. No.: 561,450

[22] Filed: Dec. 14, 1983

[51] Int. Cl.$^4$ .......................... H05K 1/05; B32B 9/04
[52] U.S. Cl. .................. 52/309.13; 428/139; 428/901; 361/398; 439/77
[58] Field of Search .......... 52/309.1, 309.13, 309.52, 52/27; 174/68.5; 361/398, 399, 408, 409; 428/901, 167, 138, 139; 52/27; 439/77; 339/17 H, 17 B, 17 E, 17 T, 17 R

[56] References Cited

U.S. PATENT DOCUMENTS

| | | | |
|---|---|---|---|
| 3,162,279 | 12/1964 | Leininger | 52/309.13 |
| 3,383,802 | 5/1968 | Janssens | 52/309.1 |
| 3,470,598 | 10/1969 | Berthelsen | 29/417 |
| 3,507,739 | 4/1970 | Jacobs | 428/139 |
| 4,075,395 | 2/1978 | Ohnishi | 428/139 |

OTHER PUBLICATIONS

Electronic Design, Jun. 11, 1958, pp. 36–39.
Electronics, Dec. 18, 1959, p. 57.

*Primary Examiner*—John E. Murtagh
*Attorney, Agent, or Firm*—George T. Noe; Peter J. Meza

[57] ABSTRACT

A composite chassis for electronic apparatus incorporates a sheet metal substrate with injection-molded plastic structural members and other details added. Certain mounting details permit good mechanical and electrical connection of external frame members, circuit boards, and other parts to the chassis.

2 Claims, 2 Drawing Sheets

COMPOSITE CHASSIS FOR ELECTRONIC APPARATUS

BACKGROUND OF THE INVENTION

The present invention relates to chassis construction in general, and in particular to a composite metal-and-plastic chassis for electronic apparatus.

Chassis constructed principally of sheet metal have long been used for electronic devices for a number of mechanical and electrical reasons. First, the chassis may be utilized structurally as part of the device frame, and such chassis generally provides a base onto which components and sub-assemblies may be mounted. Electrically, the chassis provides a convenient source of ground potential, and may also provide shielfing between electrical elements, e.g., components and circuit boards, mounted thereon.

From a manufacturing point of view, metal chassis construction represents a number of problems. Preparation of the sheet metal, including shearing, punching, bending, and welding, generally requires expensive tooling and equipment, and is a time-consuming process. Tolerances closer than ±0.015 inch are difficult to maintain in the metal-preparation process. Mechanical hardware, such as screws, nuts, washers, brackets, posts, etc., is used to assemble the chassis to other frame members and to mount components and sub-assemblies on the chassis. Accordingly, the parts and hardware count is large, assembly time can be lengthy, and in situations in which automatic hardware insertion machines are employed to install captive hardware, wrong or missing parts and parts mounted in the wrong locations may not be discovered until a time wherein rework would be tedious or time consuming.

It has also been known to construct electronic apparatus housings and cabinets of injection-molded plastic as a way of lowering manufacturing costs. This is particularly true in the case of small or portable devices, such as television sets and certain test and measurement instruments. The cost of molded plastic parts is low. Many parts, such as brackets, holders, and spacers, may be molded in, thereby eliminating many separate parts, reducing final assembly time, and reducing the hardware count. Moreover, much tighter tolerances may be achieved over large areas with the molding process, providing greater precision of parts. However, inclusion of captive hardware is almost as troublesome with a plastic base part as it is with a sheet metal chassis because human errors in the molding process are frequent, e.g., errors such as leaving parts out of the mold and improper sonic insertion. Electrically, plastics are insulators and therefore cannot be used to provide circuit grounding or electrical shields. Attempts to metallize the plastic, such as by plating or applying metallic paints, lead to further problems and expense.

SUMMARY OF THE INVENTION

In accordance with the present invention, a composite chassis for electronic apparatus combines the advantageous features of metal and plastic while largely reducing the disadvantages.

The basic chassis structure incorporates sheet metal as a substrate with injection-molded plastic structural members and other details added. The sheet metal portion may be made in one or two stamping operations, significantly reducing manufacturing time and costs. Since plastic reinforcing is used, the sheet metal may be of a thinner gauge than normally employed for chassis construction, reducing material costs and weight. The sheet metal substrate is loaded, as an insert, into an injection molding machine that adds needed details, such as flanges, brackets, support members, and mounting details, thereby forming a composite chassis of light weight while maintaining structural strength.

Other features and advantages of the present invention will become obvious to those skilled in the art upon a reading of the following detailed description when taken in conjunction with the accompanying drawings.

BRIEF DESCRIPTION OF THE DRAWINGS

FIG. 2 is a top plan view of the substrate of FIG. 1 with plastic details spotmolded on;

DETAILED DESCRIPTION OF THE INVENTION

Figure 1:
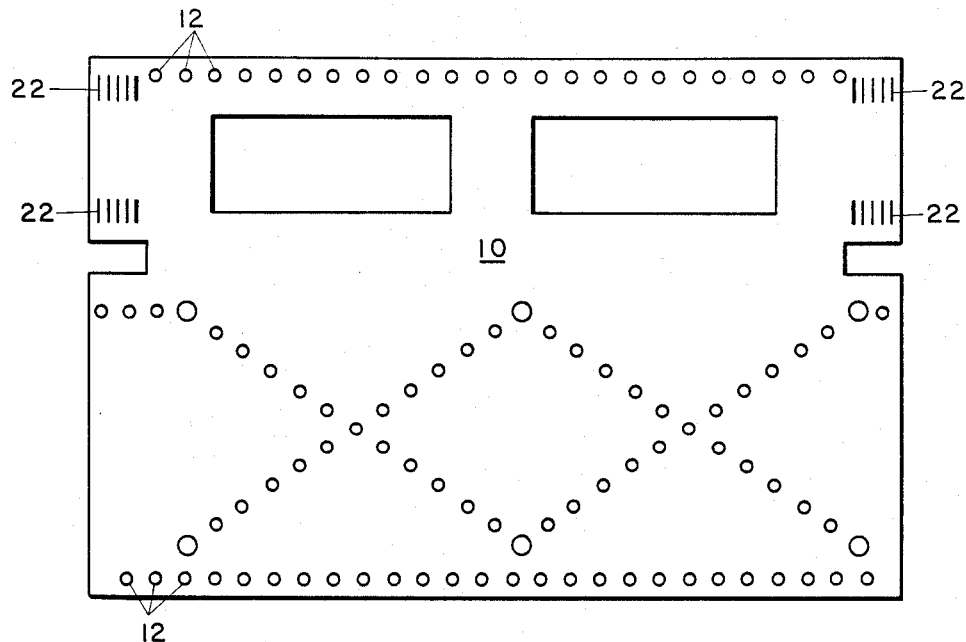
FIG. 1 is a top plan view of a sheet metal substrate for use in a composite chassis for electronic apparatus.

Referring now to FIG. 1, there is shown a top plan view of a flat sheet of metal prepared for use as a substrate 10 for a composite chassis. Substrate 10 suitably may be fabricated of any conductive metallic material, although aluminum is preferable because of its light weight, employing common conventional sheet metal fabrication techniques, such as stamping, punching, shearing, and bending. The purpose of substrate 10 is to provide electrical ground or shielding where necessary, and since the substrate is not relied upon for structural strength, the metal sheet may have a thickness of 0.025 inch or less. This is relatively thin compared with the 0.050-inch or greater thickness commonly used for all-metal chassis applications.

Figure 2:
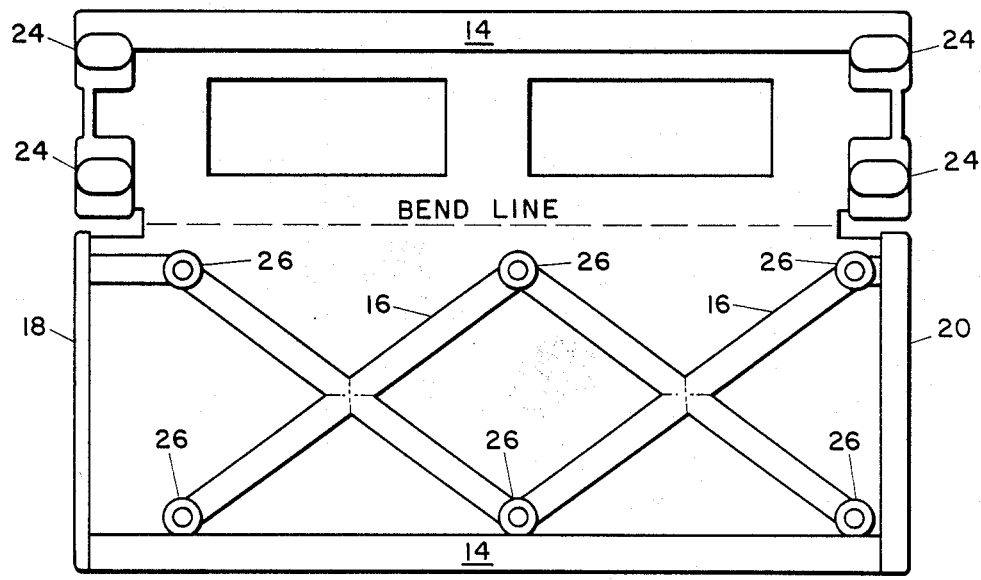
Figure 3:
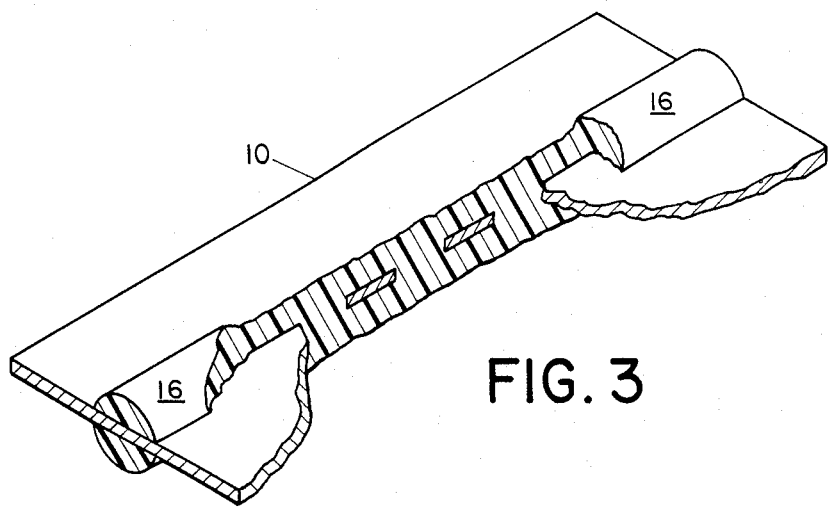
FIG. 3 is a partial cut away perspective view of an integrally-molded support member.

After preparation as shown in FIG. 1, substrate 10 is loaded as an insert into an injection molding machine wherein plastic is added to provide structural members and needed details. Refer also to FIG. 2. Rows of holes 12 along the edges of the metal sheet permit stiffening ribs 14 to be molded in place such that the plastic material is distributed on both sides of the metal sheet and joined through the holes to provide unitary molded-on plastic details that will not separate from the metal substrate. Similarly, X-bracing members 16 may be added to prevent warping or buckling of large-area substrate sections. FIG. 3 shows an example, by way of a partially cut-away perspective view, of a support member 16 and its interstitial relationship with substrate 10, giving a "sewn-on" effect.

End members or brackets 18 and 20 are molded in place and connected to other plastic structure, which holds them in place. This is exemplary of one method of adding plastic parts to the overall structure without the need to punch or drill holes in the metal substrate. In a similar manner, other details, such as flanges, brackets, spacers, mounting pins, and so forth, may be molded onto the composite chassis using conventional injection molding techniques. Applicants have coined the term spotmolding to described the effect of molding details in spots as needed.

Figure 4A:
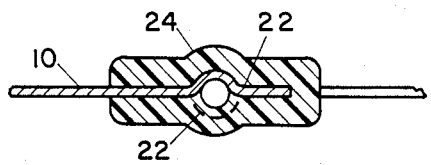
FIGS. 4A and 4B are respectively transverse and longitudinal cross-sectional views of a mounting detail for ensuring ground continuity between the chassis of the present invention and a front or rear casting.
Figure 4B:
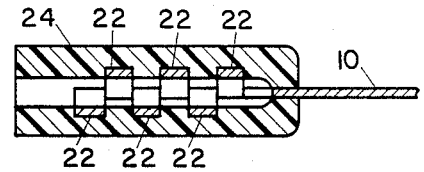

To use the sheet metal substrate as either a shield or for circuit grounding, a mounting detail was developed which provides a solid electrical as well as a mechanical connection to front and rear frame castings. A row of slits is made in the sheet metal adjacent the edge thereof, and the resulting metal strips 22 shaped by deforming them alternately thereby to form a hole into which a self-tapping metal screw may be inserted. This chassis mounting detail is then reinforced by injection molding a plastic block 24 to provide structural strength. Transverse and longitudinal cross-sectional veiws of this chassis mounting detail are shown in FIGS. 4A and 4B, respectively. Tensile tests performed on this chassis mounting detail showed that the detail was stronger than a self-tapping screw. For a 0.124-inch finished hole and a one-half inch engagement or insertion of a No. 6 self-tapping screw, the screw broke under a pullout test. It was also found under certain environmental testing that humidity or temperature did not degrade strength of this chassis mounting detail.

Figure 5:
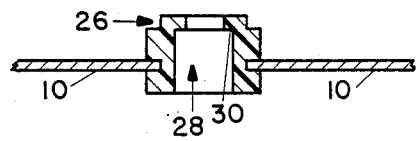
FIG. 5 through 7 show exemplary chassis mounting details.

Other mounting details include circuit-board mounting spacers 26 which permit installation of a circuit board onto the composite chassis. Actually, when properly mounted, the circuit board contributes to the structural strength of the composite chassis. The circuit-board mounting spacers may be implemented in any of several different configurations, depending upon the hardware to be used or whether a ground connection is desired. For example, spacer 26 may be a relatively simple bushing-like structures shown by the cross-section in FIG. 5, wherein a hole 28 therethrough changes diameter to provide a shoulder 30. For this configuration, either metal or plastic mounting hardware may be utilized, including plastic push fasteners, snap fasteners, or even rivets. Some of these just-mentioned fasteners may be attractive because captive hardware may not be necessary, simplifying the assembly of the circuit board to the composite chassis. Moreover, in most cases, these just-mentioned fasteners may be installed without using tools.

Figure 6:
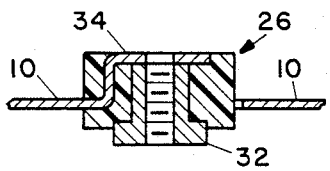

FIG. 6 shows spacer 26 implemented to provide a chassis ground connection to a circuit board. Here, the substrate 10 is formed in such a way that a metal insert 32 may be inserted and engaged in electrical contact with a raised lip portion 34 thereof. The insert 32 may be internally threaded to receive a metal machine screw, or such insert may contain a smooth bore to receive a self-tapping screw.

Figure 7:
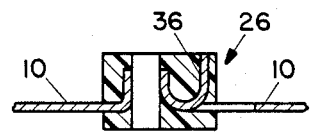

FIG. 7 shows a spacer 26 implemented to prevent stressing the plastic by ensuring that no compression takes place. Here, one or more fingers 36 are formed from the metal substrate and bent upward to provide support for a circuit board or other member. Since the plastic is not compressed, a constant tensile loading is ensured for situations requiring it, such as, for example, to ensure a gas-tight seal.

The types of material used for the metal substrate and plastic structure are for the most part not critical; however, some discussion thereof is warranted because in some cases it will be desirable to match metal and plastic to prevent appreciable stress due to different coefficients of temperature which result in different expansion and contraction rates.

For the substrate, aluminum is preferred because of its light weight and good electrical conduction properties. For the plastic, a 15% teflon polytetrafluoroethylene material 20% glass-filled polycarbonate was chosen to substantially match the plastic and aluminum.

The thermal expansion of aluminum is 0.000013 inch per inch per degree F, while for the polycarbonate mentioned, thermal expansion is 0.000015 inch per inch per degree F. Assuming an operating die temperature of about 160 F. and an ambient temperature of about 60° F. for purposes of explanation, the aluminum substrate will expand by about 0.0013 inches per inch when placed in the die, which approximates the shrinkage of the polycarbonate, about 0.0015 inches per inch, over the 100° F. temperature range assumed. This similarity in shrinkage aids in preventing finished parts from warping after they are removed from the die. Moreover, the finished parts should not build up appreciable internal stresses over a selected range of storage temperatures, for example, from −62° C. to +85° C.

The selected plastic is very rigid (800 ksi modulus of elasticity), strong (14.5 ksi tensile and 21 ksi flexural strength), and fairly ductile (9 ft-lb/in. unnotched impact). With these structural properties, the polycarbonate material is suitable for use in a composite chassis. Additionally, the selected polycarbonate material has a UL 94-VO flame rating.

While the materials selected and described hereinabove are compatible and are substantially matched thermally, the use of other materials is not precluded. In fact, in some applications, it may be desirable to utilize a less brittle plastic than the polycarbonate, particularly if a number of snap-type details or hinges are required.

From the foregoing description, it can be appreciated that a composite metal and plastic chassis may be simply and inexpensively fabricated, and exhibits electrical and mechanical characteristics desirable for use in electronic equipment. Moreover, it is simple to mold on extra parts such as special tools for service, spare parts used in assembly (such as plastic circuit board fasteners), labels, and so forth.

It will be obvious to those skilled in the art that the composite chassis for electronic apparatus described hereinabove may be implemented in many ways, and that other materials than those described may be substituted. The appended claims therefore cover all such changes and modifications as fall therewithin.

What we claim is:

1. A composite chassis for electronic apparatus, comprising:
   a substrate comprising a comparatively thin sheet of aluminum;
   an elongate plastic stiffening rib comprising 15% polytetrafluoroethylene material, 20% glass-filled polycarbonate and having a thermal expansion characteristic substantially similar to that of aluminum, said elongate plastic stiffening rib being molded integrally with said substrate to substantially provide chassis rigidity; and
   plastic mounting details molded onto said substrate to permit mechanical connection of external parts to said chassis.

2. A rigid composite structural unit comprising:
   a comparatively thin aluminum sheet having openings therein;
   a first elongate plastic stiffening rib comprising 15% polytetrafluoroethylene material, 20% glass-filled polycarbonate and having a thermal expansion characteristic substantially similar to that of aluminum, said first elongate plastic stiffening rib being molded onto a first side of said sheet;

a second elongate plastic stiffening rib comprising 15% polytetrafluoroethylene material, 20% glass-filled polycarbonate and having a thermal expansion characteristic substantially similar to that of aluminum, said second elongate plastic stiffening rib being molded onto a second side of said sheet, said stiffening ribs being molded to one another through said openings to substantially provide unit rigidity.

* * * * *